United States Patent [19]
Shin et al.

[11] Patent Number: 5,554,889
[45] Date of Patent: Sep. 10, 1996

[54] STRUCTURE AND METHOD FOR METALLIZATION OF SEMICONDUCTOR DEVICES

[75] Inventors: Hank H. Shin, Gilbert; Clarence J. Tracy, Tempe; Robert L. Duffin, Mesa; John L. Freeman, Jr., Mesa; Gordon Grivna, Mesa; Syd R. Wilson, Phoenix, all of Ariz.

[73] Assignee: Motorola, Inc., Schaumburg, Ill.

[21] Appl. No.: 430,105

[22] Filed: Apr. 27, 1995

Related U.S. Application Data

[63] Continuation of Ser. No. 862,710, Apr. 3, 1992, abandoned.

[51] Int. Cl.$^6$ .............................. A01L 23/48; A01L 23/52; A01L 29/40
[52] U.S. Cl. .............................................. 257/765; 257/771
[58] Field of Search ....................... 357/70, 67; 437/198, 437/217, 220; 257/666, 764, 765, 762, 763, 771

[56] References Cited

U.S. PATENT DOCUMENTS

| | | | |
|---|---|---|---|
| 3,725,309 | 4/1973 | Ames et al. | 252/512 |
| 4,970,176 | 11/1990 | Tracy et al. | 437/187 |

FOREIGN PATENT DOCUMENTS

| | | | |
|---|---|---|---|
| 62-240733 | 10/1987 | Japan . | |
| 62-240736 | 10/1987 | Japan . | |
| 62-240738 | 10/1987 | Japan . | |
| 62-240734 | 10/1987 | Japan . | |
| 1-124253 | 5/1989 | Japan | 357/67 |

OTHER PUBLICATIONS

1–μm EPIC Process Enhances TI's CMOS logic circuits—Electronics Design—Jun. 1986 p.21.

*Primary Examiner*—Sara W. Crane
*Assistant Examiner*—Sheila V. Clark
*Attorney, Agent, or Firm*—Kevin B. Jackson

[57] ABSTRACT

A metallization alloy for semiconductor devices comprising aluminum, copper, and tungsten is provided. In a method for applying the metallization, the metal is sputtered onto a semiconductor substrate having devices formed therein. After deposition, the metallization is patterned and etched using conventional semiconductor photoresist and etch techniques.

5 Claims, No Drawings

STRUCTURE AND METHOD FOR METALLIZATION OF SEMICONDUCTOR DEVICES

This application is a continuation of prior application Ser. No. 07/862,710, filed Apr. 3, 1992, now abandoned.

BACKGROUND OF THE INVENTION

The present invention relates, in general, to metallization for semiconductor devices, and more particularly, to a homogeneous alloy metallization that exhibits reduced stress voiding.

Semiconductor devices use metallization to provide interconnections between devices formed on integrated circuits. Experts predict that performance limits of future integrated circuits will be determined by the performance of the device interconnections. Commonly, metallization schemes use aluminum and aluminum-copper alloys. One problem with aluminum-copper alloy is that stress voids form in metal lines and vias. Stress voids are small areas where metal is missing from the metal line or via. Stress voids reduce the cross-sectional area of the metal line causing increased current density in the metal line during device operation. Because high current density negatively affects reliability of the metal line, the stress voids limit long term reliability of the devices.

One method of controlling stress voids is to use a titanium-tungsten (TiW) alloy barrier layer beneath the metallization. Thin titanium-tungsten alloy cap layers formed on top of the metallization layer also control stress voiding. One problem with these TiW layers is that they require additional deposition steps, increasing processing cost for the semiconductor devices. Also, separate TiW layers increase equipment costs and cycle time for metallization processing. Moreover, sputter deposition of the TiW layers results in high levels of particulate contamination of the semiconductor device. TiW layers are subject to corrosion during reactive ion etching. Finally, titanium in the TiW alloy can interdiffuse into the aluminum-copper metallization during temperature cycling, resulting in increased resistivity.

What is needed is a metallization scheme for semiconductor devices which reduces stress voids without increasing cost, lowering reliability, or substantially increasing resistivity of the metallization.

SUMMARY OF THE INVENTION

Briefly stated, the present invention is a metallization alloy for semiconductor devices comprising aluminum, copper, and tungsten. In a method for applying the metallization, the metal is sputtered onto a semiconductor substrate having devices formed therein. After deposition, the metal can be patterned and etched using conventional semiconductor photoresist and etch techniques.

DETAILED DESCRIPTION OF THE PREFERRED EMBODIMENT

Semiconductor device and integrated circuit manufacturers make wide use of aluminum and aluminum-copper alloy metallization schemes. While aluminum is historically a satisfactory interconnection metal, as designers scale down device dimensions and increase current density, pure aluminum is susceptible to the problems of electromigration, hillock growth, and stress voiding. To overcome the problems experienced with pure aluminum, aluminum has been alloyed with copper to form aluminum-copper. Aluminum and aluminum-copper metallizations are described in U.S. Pat. No. 3,725,309 issued to Ames et al. on Apr. 3, 1973, which is incorporated herein by reference. Aluminum-copper metallization, however, fails to solve the problem of stress voiding.

Stress voids result from the large differences between the thermal expansion coefficients of the metal interconnect lines and the substrate. A multi-layered structure of aluminum-copper alloy with a layer of titanium-tungsten effectively reduces stress voids. Further experiments led to the discovery that W layers positioned above, below, or in the middle of the Al-Cu metallization layer also reduce stress voiding. The experiments showed that tungsten layers alone reduced stress voiding.

Further studies with tungsten inserts in an aluminum copper sputtering target used to produce composite films showed that resulting structures controlled stress voiding. Thus, minute quantities of tungsten in AlCu metallization prevent stress voiding.

The metallization in accordance with the present invention comprises aluminum, copper, and tungsten combined as a homogeneous alloy. It is desirable to eliminate titanium from the metallization scheme thereby eliminating problems of increased resistivity caused by titanium diffusion into the AlCu metallization. Moreover, because the tungsten is incorporated in a homogeneous alloy, the present invention does not require multiple layer metallization. Accordingly, the present invention does away with the increased particulates created by additional processing and sputtering of TiW and eliminates the costs associated with the TiW deposition process.

In a preferred embodiment, tungsten content should be less than 0.5 weight percent (wt. %) to provide acceptable resistivity. Typical copper content is approximately 1.5 wt. % Cu, although copper content can be varied substantially from 0.0 wt. % to approximately 5.0 wt. % Cu. In a sample structure, a homogeneous alloy comprising Al—1.5 wt. % Cu—0.63 wt. % W resulted in 3.94 micro-ohm-centimeter resistivity which compares favorably with 3.39 micro-ohm-centimeter resistivity without any tungsten. Lower tungsten content lowers resistivity of the alloy further.

The alloy metallization in accordance with the present invention can be applied by conventional metal deposition techniques such as sputtering, evaporation, or the like. A compatible deposition method is shown in U.S. Pat. No. 4,970,176 issued to Tracy et al on Nov. 30, 1990 and incorporated herein by reference. The preferred method of applying the metallization in accordance with the present invention is sputtering. Sputter targets are manufactured comprising a homogeneous Al-Cu-W alloy. The metallization is applied to a semiconductor substrate having integrated circuitry formed therein by sputtering the metal from the target onto the substrate. The deposition step is followed by a conventional photoresist patterning and metal etch process.

In an alternative embodiment, a homogeneous aluminum-copper alloy is deposited as a separate layer from the tungsten. A tungsten layer can be formed above, below, or as an intermediate layer with an aluminum metallization. The tungsten layer is preferably a few hundred angstroms thick.

The aluminum-copper layer and the tungsten layer are heated, causing the tungsten to diffuse into the aluminum-copper alloy to provide the aluminum-copper-tungsten alloy in accordance with the present invention. Because this second embodiment requires multiple depositions and multiple sputter targets, in most applications it is preferred to use a single Al-Cu-W homogeneous alloy as described hereinbefore.

By now it should be appreciated that a metallization scheme and method for applying metallization which is free of stress voids to a semiconductor device is provided. Further, the metallization scheme in accordance with the present invention eliminates the need for multilayer metallizations as well as contamination and costs associated with multilayer metal processes.

We claim:

1. A semiconductor device metallization scheme for reducing stress voids, wherein the metallization consists of a homogeneous alloy of aluminum, copper and tungsten.

2. The metallization of claim 1 wherein the homogeneous alloy comprises less than 0.5 weight percent tungsten.

3. The metallization of claim 1 wherein the homogeneous alloy comprises approximately 1.5 weight percent copper and less than 0.5 weight percent tungsten.

4. A homogeneous alloy for controlling stress voiding consisting of aluminum, copper, and tungsten.

5. The alloy of claim 4 wherein the tungsten makes up less than 0.5 weight percent of the homogeneous alloy.

* * * * *